United States Patent
Bellman et al.

(10) Patent No.: US 10,578,777 B2
(45) Date of Patent: Mar. 3, 2020

(54) COATED ARTICLES THAT INCLUDE EASY-TO-CLEAN COATINGS

(71) Applicant: CORNING INCORPORATED, Corning, NY (US)

(72) Inventors: Robert Alan Bellman, Painted Post, NY (US); Chang-gyu Kim, Cheongju-si (KR); Eric Louis Null, Corning, NY (US); Jung-keun Oh, Gwangmyeong-si (KR); Sang-Yoon Oh, Cheonan (KR); Jin-ah Yoo, Hwaseong-si (KR)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 16/015,538

(22) Filed: Jun. 22, 2018

(65) Prior Publication Data
US 2018/0372920 A1 Dec. 27, 2018

Related U.S. Application Data

(60) Provisional application No. 62/523,981, filed on Jun. 23, 2017.

(51) Int. Cl.
| | |
|---|---|
| *B32B 3/00* | (2006.01) |
| *G02B 1/14* | (2015.01) |
| *C23C 14/08* | (2006.01) |
| *C23C 14/10* | (2006.01) |
| *H05K 5/03* | (2006.01) |
| *G02B 1/115* | (2015.01) |

(Continued)

(52) U.S. Cl.
CPC ............... *G02B 1/14* (2015.01); *C23C 14/081* (2013.01); *C23C 14/10* (2013.01); *G02B 1/115* (2013.01); *G02B 1/18* (2015.01); *H05K 5/0017* (2013.01); *H05K 5/03* (2013.01)

(58) Field of Classification Search
CPC .......... G02B 1/14; G02B 1/18; C23C 14/081; C23C 14/10; H05K 5/0017; H05K 5/03
See application file for complete search history.

(56) References Cited

U.S. PATENT DOCUMENTS

| | | |
|---|---|---|
| 8,312,739 B2 | 11/2012 | Lee et al. |
| 8,817,379 B2 | 8/2014 | Saeedi et al. |

(Continued)

FOREIGN PATENT DOCUMENTS

WO 2017070769 A1 3/2017

OTHER PUBLICATIONS

International Search Report and Written Opinion PCT/US2018/038948 dated Oct. 18, 2018, 11 Pgs.

(Continued)

*Primary Examiner* — Elizabeth E Mulvaney

(57) ABSTRACT

According to one or more embodiments disclosed herein, a coated article may include a substrate and an optical coating. The optical coating may be disposed on a major surface of the substrate and may form an air-side surface. The optical coating may include an optical stack, an adhesion coating, and an easy-to-clean coating. The adhesion coating may comprise an alumina layer and a silica layer. The present disclosure is also directed to methods for depositing optical coatings on substrates and to consumer electronic products which include the coated articles.

20 Claims, 7 Drawing Sheets

(51) Int. Cl.
*H05K 5/00* (2006.01)
*G02B 1/18* (2015.01)

(56) References Cited

U.S. PATENT DOCUMENTS

| | | | |
|---|---|---|---|
| 2004/0081764 A1 | 4/2004 | Liu et al. | |
| 2010/0009154 A1 | 1/2010 | Allan et al. | |
| 2014/0113083 A1 | 4/2014 | Lee et al. | |
| 2014/0147654 A1 | 5/2014 | Walther et al. | |
| 2014/0334006 A1 | 11/2014 | Adib et al. | |
| 2015/0152558 A1* | 6/2015 | Walther | C03C 17/42 428/216 |
| 2017/0044340 A1 | 2/2017 | Farah et al. | |
| 2017/0197875 A1* | 7/2017 | Fujii | C03C 17/42 |
| 2018/0162771 A1* | 6/2018 | Fujii | C03C 3/085 |
| 2018/0230589 A1 | 8/2018 | Lee et al. | |
| 2018/0275318 A1* | 9/2018 | Amin | C03C 10/00 |
| 2018/0319704 A1* | 11/2018 | Adib | C03C 17/42 |
| 2018/0339939 A1* | 11/2018 | Hashimoto | C03C 17/42 |

OTHER PUBLICATIONS

Chan et al; "Fracture Toughness Improvements of Dental Ceramic Through Use of Yttria-Stabilized Zirconia (YSZ) Thin-Film Coating"; Dental Materials; 29 (2013) pp. 881-887.

Charles Kittel, "Introduction to Solid State Physics," Seventh Edition, John Wiley & Sons, Inc., NY, 1996, pp. 611-627.

Fischer-Cripps; "Critical Review of Analysis and Interpretation of Nanoindentation Test Data"; Surface & Coatings Technology, 200 (2006); pp. 4153-4165.

Harding et al; "Cracking During Nanoindentation and Its Use in the Measurement of Fracture Toughness"; Mat. Res. Soc. Symp. Proc. vol. 356; (1995) pp. 663-668.

Hay et al; "Continuous Stiffness Measurement During Instrumented Indentation Testing"; Experimental Techniques; (2010) pp. 86-94.

Ruddell et al; "The Effect of Deposition Parameters on the Properties of Yttria-Stabilized Zirconia Thin Films"; Thin Solid Films, 445 (2003) pp. 14-19.

Shackelford; "Introduction to Materials Science for Engineers," Sixth Edition, Pearson Prentice Hall, New Jersey, 2005, pp. 404-418.

Smart and Moore, "Solid State Chemistry, an Introduction," Chapman & Hall University and Professional Division, London, 1992, pp. 136-151.

Sonderby et al; "Deposition of Yttria-Stabilized Zirconia Thin Films by High Power Impulse Magnetron Sputtering and Pulsed Magnetron Sputtering"; Surface and Coating Technology, 240 (2014) pp. 1-6.

Wang et al; "Toward Hard Yet Though Ceramic Coatings"; Surface & Coatings Technology, 258 (2014); pp. 1-6.

* cited by examiner

COATED ARTICLES THAT INCLUDE EASY-TO-CLEAN COATINGS

CROSS-REFERENCE TO RELATED APPLICATION

This application claims the benefit of priority under 35 U.S.C. § 119 of U.S. Provisional Application Ser. No. 62/523,981 filed on Jun. 23, 2017, the content of which is relied upon and incorporated herein by reference in its entirety.

BACKGROUND

Field

This disclosure relates to coated articles and methods for making the same and, more particularly, to optical coatings on substrates.

Technical Background

Cover articles are often used to protect devices within electronic products, to provide a user interface for input and/or display, and/or many other functions. Such products include mobile devices, such as smart phones, mp3 players, and computer tablets. Cover articles also include architectural articles, transportation articles (e.g., articles used in automotive applications, trains, aircraft, sea craft, etc.), appliance articles, or any article that may benefit from some transparency, scratch-resistance, abrasion resistance, or a combination thereof.

For some cover articles, a lubricous exterior surface of the cover article may be desired. For example, a coating applied onto a transparent substrate may be preferred by users due to its perceived smooth or slippery feeling to the touch. Additionally, a lubricous surface of a cover article may impart other advantageous physical characteristics, such as resistance to physical damage by checking. Reduction in checking may impart improved strength on the substrate of the cover article.

However, lubricous coatings may be susceptible to abrasion damage and, often, are even more susceptible to abrasion damage than the underlying substrates on which such coatings are disposed. Abrasion damage can include reciprocating sliding contact from counter face objects (e.g., fingers). In addition, abrasion damage can generate heat, which can degrade chemical bonds in the film materials and cause flaking and other types of damage to the cover glass. Since abrasion damage is often experienced over a longer term than the single events that cause scratches, the coating materials experiencing abrasion damage can also oxidize, which can further degrades the durability of the coating.

Accordingly, a need exists for optical coatings which have a lubricous feel, while imparting desirable optical characteristics and/or good resistance to abrasion damage.

SUMMARY

According to some embodiments, a coated article may comprise a substrate and an optical coating. The substrate may have a major surface. The optical coating may be disposed on the major surface of the substrate and may form an air-side surface. The optical coating may comprise an optical stack, an adhesion coating, and an easy-to-clean coating. The adhesion coating may be positioned over the optical stack. The adhesion coating may comprise an alumina layer and a silica layer. The silica layer may be positioned over the alumina layer. The easy-to-clean coating may be positioned over the adhesion coating and may define the air-side surface of the optical coating.

According to additional embodiments, a consumer electronic product may comprise a housing, electrical components, and a cover substrate. The housing may comprise a front surface, a back surface and side surfaces. The electrical components may be at least partially within the housing. The electrical components may comprise at least a controller, a memory, and a display. The display may be at or adjacent the front surface of the housing. The cover substrate may be disposed over the display. At least one of a portion of the housing or the cover substrate may comprise a coated article as described herein.

According to additional embodiments, an optical coating may be deposited on a substrate by a method that may comprise depositing an optical stack over a major surface of the substrate, depositing an adhesion coating over the optical stack, and depositing an easy-to-clean coating over the adhesion coating. The adhesion coating may comprise an alumina layer and a silica layer over the alumina layer. The easy-to-clean coating may define an air-side surface of the optical coating.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

DETAILED DESCRIPTION

Reference will now be made in detail to various embodiments of coated articles, examples of which are illustrated in the accompanying drawings. According to one or more embodiments, the coated articles may comprise a substrate (such as a transparent substrate in some embodiments) and an optical coating. The optical coating may comprise an optical stack, an adhesion coating, and an easy-to-clean ("ETC") coating, where the adhesion coating is between the optical stack and the ETC coating. The ETC coating may be disposed as the most outer layer of the optical coating, defining an air-side surface of the optical coating. In one or more embodiments, the adhesion coating may include a silica layer and an alumina layer, where the silica layer is positioned over the alumina layer. For example, the silica layer may be in direct contact with the optical stack and the silica layer may be in direct contact with the ETC coating. The adhesion coating may promote bonding between the ETC coating and the optical stack, which may increase mechanical durability of the optical coating. For example, optical coatings with an adhesion coating comprising silica over alumina may impart improved mechanical durability as compared to an optical coating where the ETC coating is directly in contact with the optical stack (even when the top layer of the optical stack is silica) or to an optical coating where a silica capping layer (i.e., without alumina) is utilized.

Figure 1:
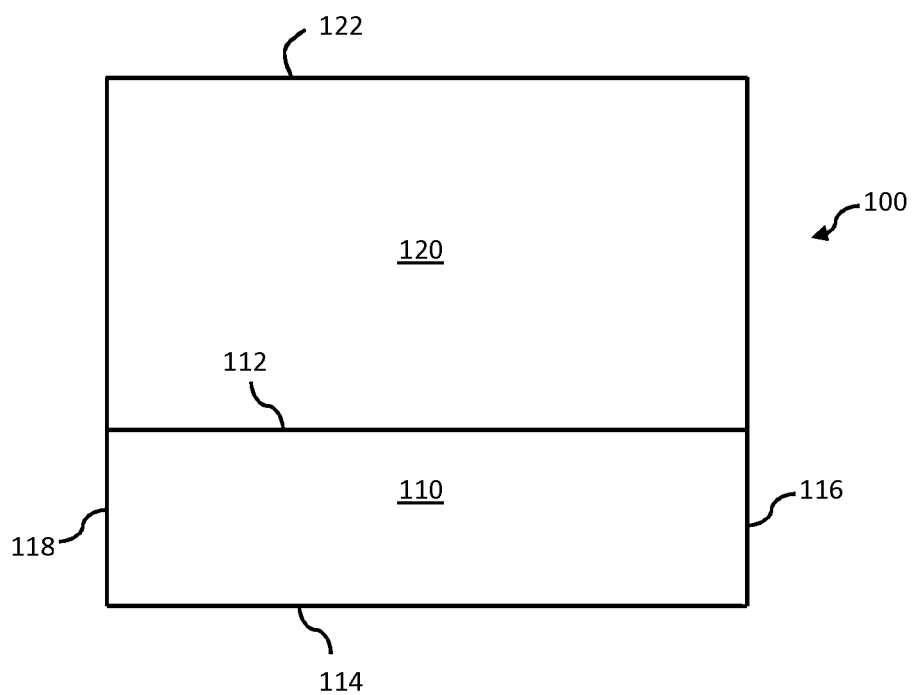
FIG. 1 is a cross-sectional side view of a coated article that includes an optical coating on a substrate, according to one or more embodiments described herein.

Referring to FIG. 1, a coated article 100 according to one or more embodiments may include a substrate 110 and an optical coating 120 disposed on the substrate 110. As used herein, an optical coating refers to any coating which imparts beneficial properties on a substrate such as, for example, anti-reflectance, colorlessness, etc. The optical coating 120 may comprise the optical stack, the adhesion coating, and the ETC coating (not depicted in FIG. 1), which will be discussed with reference to other figures. The substrate 110 includes opposing major surfaces 112, 114 and opposing minor surfaces 116, 118. The major surface 112 may be substantially planar in one or more portions of the substrate 110. However, in some embodiments, the major surface 112 may be non-planar, such as curved in one or more portions or curved over the entire major surface 112. The optical coating 120 is shown in FIG. 1 as disposed on a first opposing major surface 112; however, the optical coating 120 may be disposed on the second opposing major surface 114 and/or one or both of the opposing minor surfaces 116, 118, in addition to or instead of being disposed on the first opposing major surface 112. The optical coating 120 forms an air-side surface 122 on its side opposite the major surface 112.

The optical coating 120 includes at least one layer of at least one material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments, a layer may include one or more contiguous and uninterrupted layers and/or one or more discontinuous and interrupted layers (i.e., a layer having different materials formed adjacent to one another). A layer or sub-layer may be formed by any known method in the art, including discrete deposition or continuous deposition processes. In one or more embodiments, the layer may be formed using only continuous deposition processes, or, alternatively, only discrete deposition processes.

As used herein, the term "dispose" includes coating, depositing, and/or forming a material onto a surface using any known or to be developed method in the art. The disposed material may constitute a layer, as defined herein. As used herein, the phrase "disposed on" includes forming a material onto a surface such that the material is in direct contact with the surface, or alternatively includes embodiments where the material is formed on a surface with one or more intervening material(s) disposed between material and the surface. The intervening material(s) may constitute a layer, as defined herein.

Also disclosed herein are methods for depositing optical coatings onto substrates. It should be understood that all disclosed embodiments of the optical coatings (e.g., particular thicknesses, materials, physical properties, etc.) may be implemented in embodiments of deposition processes, where various layers of the optical coating are deposited over the substrate.

In one or more embodiments, a single layer or multiple layers of the optical coating 120 may be deposited onto the substrate 110 by a vacuum deposition technique such as, for example, chemical vapor deposition (e.g., plasma enhanced chemical vapor deposition (PECVD), low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition. Liquid-based methods may also be used such as spraying, dipping, spin coating, or slot coating (e.g., using sol-gel materials). Generally, vapor deposition techniques may include a variety of vacuum deposition methods which can be used to produce thin films. For example, physical vapor deposition uses a physical process (such as heating or sputtering) to produce a vapor of material, which is then deposited on the object which is coated.

The optical coating 120 may have thickness of from about 100 nm to about 10 micrometers (microns or µm). For example, the optical coating 120 may have a thickness greater than or equal to about 200 nm, 300 nm, 400 nm, 500 nm, 600 nm, 700 nm, 800 nm, 900 nm, 1 micron, 2 microns, 3 microns, 4 microns, 5 microns, 6 microns, 7 microns, or even 8 microns, and less than or equal to about 10 microns. As described herein, the "thickness" of a coating or layer refers to the thickness as measured substantially orthogonal to the surface of the substrate 110 upon which the optical coating 120 is deposited. For, example, in FIG. 1, thicknesses are measured in the direction substantially orthogonal to major surface 112 (i.e., in the vertical direction). Thickness of the thin film elements (e.g., scratch-resistant film/layer, optical coating, layers of the optical coating, optical stack, etc.) may be measured by scanning electron microscope (SEM) of a cross-section, by optical ellipsometry (e.g., by an analyzer commercially available from n&k Technology), or by thin film reflectometry. For multiple layer elements (e.g., optical stack), thickness measurements by SEM may be most suitable.

Figure 2:
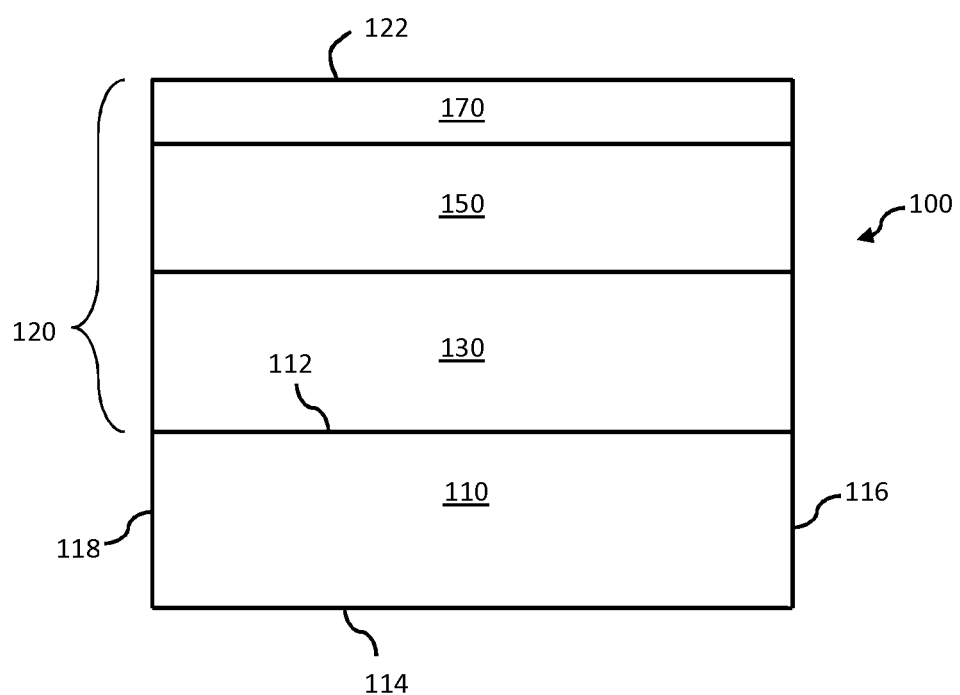
FIG. 2 is a cross-sectional side view of a coated article depicting an optical stack, an adhesion coating, and an ETC (easy-to-clean) coating of an optical coating, according to one or more embodiments described herein.

Now referring to FIG. 2, according to one or more embodiments, the optical coating 120 may comprise an optical stack 130, an ETC coating 170, and an adhesion coating 150 between the optical stack 130 and the ETC coating 170. The optical stack 130 may comprise a plurality of layers, such as a silica layer and an aluminum oxynitride layer, as will be explained in detail below with reference to FIG. 3. In one or more embodiments, the adhesion coating 150 may be in direct contact with the optical stack 130 and with the ETC coating 170. The optical stack 130 generally comprises a plurality of layers which impart optical characteristics, such as colorlessness and/or anti-reflectiveness, upon the coated article. As will be explained with reference to FIG. 4 in detail below, the optical stack 130 may comprise alternating layers of high refractive index and low refractive index materials. According to some embodiments, the optical stack 130 may impart hardness and/or scratch resistance on the coated article 100 through the use of specific materials and/or the positioning and thickness of those specific materials.

Referring again to FIG. 2, the ETC coating 170 may be positioned over the adhesion coating 150 and may be the outermost layer of the optical coating 120 (i.e., defining the air-side surface 122 of the optical coating 120). The ETC coating 170 may be a lubricous layer comprising, for example, a fluorinated material. The ETC coating 170 may contain one or more sub-layers with varying composition.

According to one or more embodiments, the ETC coating 170 may comprise a fluorinated material, e.g., a perfluoropolyether (PFPE) silane, a pefluoroalkylether, a PFPE oil or other suitable fluorinated material. According to some embodiments, the thickness of the ETC coating 170 is from about 1 nm to about 20 nm. In other embodiments, the thickness of the ETC coating 170 ranges from 1 nm to about 200 nm, 1 nm to about 100 nm, and 1 nm to about 50 nm. In some embodiments, the ETC coating 170 may have a thickness of from about 0.5 nm to about 50 nm, from about 1 nm to about 25 nm, from about 4 nm to about 25 nm, or from about 5 nm to about 20 nm. In other embodiments, the ETC coating 170 may have a thickness of from about 10 nm to about 50 nm.

As understood by those with ordinary skill in the field of the disclosure, various source materials can be used to form the ETC coating 170 of the coated article 100 depicted in FIGS. 1-4. For example, ETC coating source materials may comprise perfluoropolyether (PFPE) silanes, perfluoropolyether (PFPEs) alkoxy silanes, copolymers of these PFPEs and mixtures of these PFPEs. In certain, exemplary embodiments of the coated articles 100 of the disclosure, the ETC coating 170 can comprise a perfluoropolyether (PFPE) silane of formula $[CF_3CF_2CF_2O)_a]_y SiX_{4-y}$ where a is from 5 to 50, y=1 or 2, and X is —Cl, acetoxy, —$OCH_3$ or $OCH_2H_3$, wherein the total perfluoropolyether chain length is 6-130 carbon atoms from the silicon atom to the end of the chain at its greatest length. In other aspects, "a" in the above formula can range from about 10 to 30. Further, it should be understood that the above PFPE formula is one of many suitable types of PFPE suitable for use in the ETC coatings of the disclosure; consequently, it is offered as an exemplary chemistry that is in no way intended to limit the formulas or mixtures of formulas suitable for the ETC coatings of the disclosure. As such, other PFPEs can be employed in the ETC coating 170 that vary in the structure of the perfluoropolyether chain and/or attachment chemistry relative to the exemplary form provided above. For example, an Optool™ UF503 fluorinated coating material from Daikin Industries is another suitable PFPE that can be employed for the ETC coating 170. Another suitable ETC coating may be SH-HT anti-fingerprint coating material (commercially available from DON Co., Ltd., Korea). As used herein, the length of the carbon chain in nanometers ("nm") is the product of the number of carbon-carbon bonds along the greatest length of the chain multiplied by the carbon-carbon single bond length of 0.154 nm. In some embodiments, the carbon chain length of the perfluoropolyether (PFPE) group can range from about 0.1 nm to about 50 nm, from about 0.5 nm to about 25 nm, or from about 1 nm to about 20 nm.

As also noted earlier, embodiments of the ETC coating 170 can comprise a PFPE oil. According to some embodiments, the PFPE oil employed in the ETC coating 170 can be solubilized in an ETC component bound directly to the adhesion coating 150. In general, PFPE oils are characterized by oxidation resistance. In other aspects, the PFPE oil of the ETC coating 170 is a discreet layer disposed over an ETC component bound directly to the adhesion coating 150. In further aspects, the PFPE oil of the ETC coating 170 is a combination of solubilized and discreet layers. According to some embodiments, the PFPE oil employed in the ETC coating 170 can comprise a Solvay Fomblin® Z type oil, a Fomblin® Y type oil, a Fomblin® K type oil, Krytox™ K type oil from The Chemours Company, a Demnum™ type oil from Daikin Industries or other similar PFPE oil.

An example of a suitable easy-to-clean coating is described in U.S. patent application Ser. No. 13/690,904, entitled "PROCESS FOR MAKING OF GLASS ARTICLES WITH OPTICAL AND EASY-TO-CLEAN COATINGS," filed on Nov. 30, 2012, which is incorporated herein in its entirety by reference. The easy-to-clean coating 170 may alternately or additionally comprise a low-friction coating or surface treatment. Exemplary low-friction coating materials may include silanes (e.g. fluorosilanes), phosphonates, alkenes, and alkynes. According to one or more embodiments, the ETC coating 170 may comprise or consist essentially of fluorinated silanes, such as a perfluoropolyethersilane. For example, the ETC coating 170 may comprise 50 wt. % or more, 60 wt. % or more, 70 wt. % or more, 80 wt. % or more, 90 wt. % or more, 95 wt. % or more, or even 99 wt. % or more of fluorinated silane.

Figure 3:
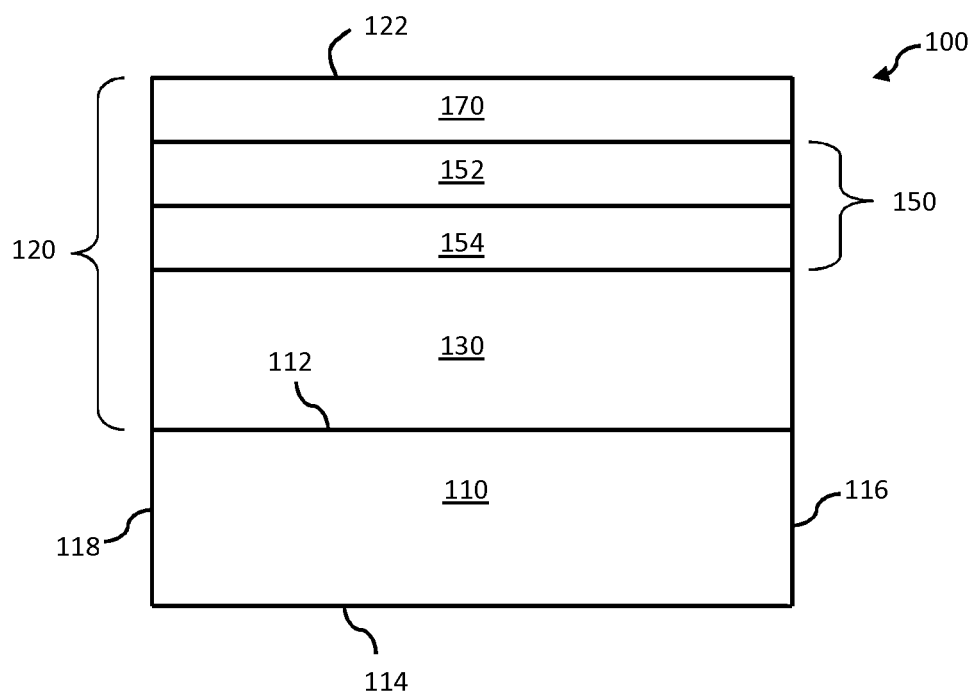
FIG. 3 is a cross-sectional side view of a coated article depicting a detailed view of the adhesion coating, according to one or more embodiments described herein.

Now referring to FIG. 3, the adhesion coating 150 may comprise multiple layers, such as an alumina layer 154 and a silica layer 152. The silica layer 152 may be positioned over the alumina layer 154 and be in direct contact with the ETC coating 170. The alumina layer 154 may be positioned directly over and in direct contact with the optical stack 130. The alumina layer 154 may be in direct contact with the silica layer 152. The silica layer 152 and the alumina layer 154 may comprise of 90 mol. % or more, 95 mol. % or more, 99 mol. % or more, or may consist of silica and alumina, respectively. In some embodiments, the uppermost layer of the optical stack 130 may be a silica layer, and in such embodiments, the alumina layer 154 may be positioned between silica layers (i.e., between an uppermost silica layer of the optical stack 130 and the silica layer 152).

According to one or more embodiments, the silica layer 152 may have a thickness of from 1 nm to 100 nm, such as from 2 nm to 50 nm, or from 5 nm to 30 nm. In additional embodiments, the silica layer 152 may have a thickness of from 2 nm to 10 nm, from 2 nm to 20 nm, from 2 nm to 30 nm, from 2 nm to 40 nm, from 10 nm to 50 nm, from 20 nm to 50 nm, from 30 nm to 50 nm, or from 40 nm to 50 nm.

According to additional embodiments, the alumina layer 154 may have a thickness of from 1 nm to 100 nm, such as from 2 nm to 30 nm. For example, the alumina layer 154 may have a thickness of from 2 nm to 10 nm, from 2 nm to 20 nm, from 10 nm to 30 nm, from 20 nm to 30 nm.

Without being bound by theory, it is believed that, in some embodiments, a relatively small thickness of the alumina layer 154 (e.g., 30 nm or less or even 15 nm or less) is beneficial to the optical properties of the coated article 100. It is believed that the relatively small thickness of the alumina layer 154 may not degrade from the specialized optical characteristics of the optical stack 130 such as low reflectance. Without being bound by theory, it is also believed that the relatively high hardness of alumina contributes to the good wear resistance of the ETC coating 170 and the good durability and/or scratch resistance of the overall optical coating 120. In some embodiments, the alumina layer 154 may form a "bearing" layer which stops damage below the depth of the alumina layer 154 when exposed to abrasive forces, such as those similar to contact by steel wool. Additionally, it is believed that the silica layer 152 may act as a tie layer between the material of the optical stack 130 and the ETC coating 170.

In additional embodiments, the adhesion coating 150 may have a thickness of from 1 nm to 150 nm, such as from 5 nm to 50 nm, or from 15 nm to 25 nm. Without being bound by theory, it is believed that in some embodiments, a thickness of about 20 nm of the adhesion coating 150 may be suitable for good bonding between the optical stack 130 and the ETC coating 170. For example, an adhesion coating 150 of about 20 nm may provide good coverage on the optical coating 120 while not significantly disrupting the desired optical properties imparted by the optical stack 130. However, it should be recognized that other thicknesses may be suitable in various embodiments. It should be understood that in some embodiments, particularly those where the top layer of the optical stack has the same or a similar composition as the alumina layer 154, that the end of the optical stack 130 and the beginning of the adhesion coating 150 may be based on deposition method differences. For example, the optical stack 130 may be deposited by PVD and the adhesion coating 150 may be deposited by sputtering. While having the same or similar composition, these two layers may be distinct as described herein.

Figure 4:
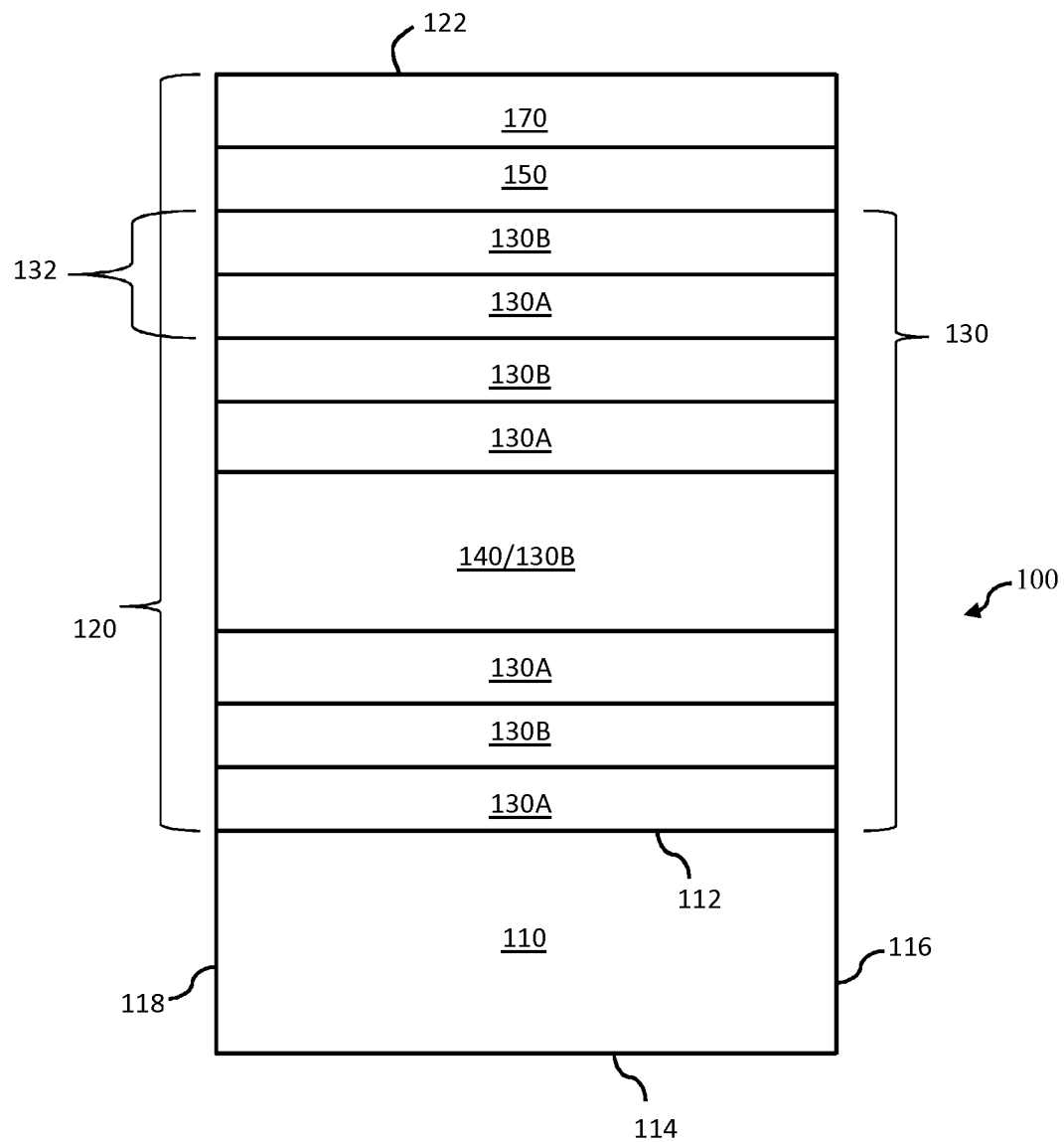
FIG. 4 is a cross-sectional side view of a coated article depicting a detailed view of the optical stack, according to one or more embodiments described herein.

Now referring to FIG. 4, embodiments of the optical stack 130 are depicted in detail. The optical stack 130 may impart enhanced optical characteristics to the coated article 100 (e.g., anti-reflectiveness and/or high transmittance). In some embodiments, the optical stack 130 may provide scratch or other damage resistance. In such embodiments, the optical stack 130 may include one or more materials which are relatively hard and/or scratch resistant. According to embodiments, the optical stack 130 may include multiple layers of deposited material which may impart the optical characteristic and/or hardness to the coated article 100. In some embodiments, the optical stack 130 may include a scratch-resistant layer 140, which may have high hardness and contribute to the anti-scratch properties of the optical coating 120.

In one or more embodiments, the optical stack 130 may include a plurality of layers (130A, 130B). The optical stack 130 may include at least one period 132 comprising two layers, such as the low RI layer 130A and high RI layer 130B. As shown in FIG. 4, the optical stack 130 may include a plurality of periods 132. In other embodiments, a single period may include three layers such as a low RI layer, a medium RI layer, and a high RI layer. Throughout this disclosure, it should be understood that FIG. 4 depicts example embodiments of an optical stack 130 having periods 132 and that that the properties (e.g., color, hardness, etc.) and materials of the optical stacks 130 described herein should not be limited to the embodiments of FIG. 4.

As used herein, the terms "low RI", "high RI" and "medium RI" refer to the relative values for the refractive index ("RI") to one another (i.e., low RI<medium RI<high RI). In one or more embodiments, the term "low RI", when used with the low RI layer, includes a range from about 1.3 to about 1.7 or 1.75. In one or more embodiments, the term "high RI", when used with the high RI layer, includes a range from about 1.7 to about 2.5 (e.g., about 1.85 or greater). In one or more embodiments, the term "medium RI", when used with a third layer of a period, includes a range from about 1.55 to about 1.8. In some embodiments, the ranges for low RI, high RI, and/or medium RI may overlap; however, in most instances, the layers of the optical stack 130 have the general relationship regarding RI of: low RI<medium RI<high RI (where "medium RI" is applicable in the case of a three layer period). In one or more embodiments, the difference in the refractive index of the low RI layer and the high RI layer may be about 0.01 or greater, about 0.05 or greater, about 0.1 or greater, or even about 0.2 or greater.

For example, in FIG. 4 the period 132 may include a low RI layer 130A and a high RI layer 130B. When a plurality of periods are included in the optical coating 120, the low RI layers 130A (designated as "L") and the high RI layers 130B (designated as "H") alternate in the following sequence of layers: L/H/L/H . . . or H/L/H/L . . . , such that the low RI layers and the high RI layers alternate along the physical thickness of the optical coating 120. In the embodiments depicted in FIG. 4, the optical stack 130 includes four periods 132, where each period 132 includes a low RI layer 130A and a high RI layer 130B. In some embodiments, the optical stack 130 may include up to 25 periods. For example, the optical stack 130 may include from about 2 to about 20 periods, from about 2 to about 15 periods, from about 2 to about 10 periods, from about 2 to about 12 periods, from about 3 to about 8 periods, or from about 3 to about 6 periods.

Example materials suitable for use in the optical stack 130 include, without limitation, $SiO_2$, $Al_2O_3$, $GeO_2$, SiO, $AlO_xN_y$, AlN, $SiN_x$, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, other materials cited below as suitable for use in a scratch-resistant layer, and other materials known in the art. In one or more embodiments, the optical stack 130 may comprise an uppermost layer comprising silica. Some examples of suitable materials for use in a low RI layer 130A include, without limitation, $SiO_2$, $Al_2O_3$, $GeO_2$, SiO, $AlO_xN_y$, $SiO_xN_y$, $Si_uAl_vO_xN_y$, MgO, $MgAl_2O_4$, $MgF_2$, $BaF_2$, $CaF_2$, $DyF_3$, $YbF_3$, $YF_3$, and $CeF_3$. The nitrogen content of the materials for use in a low RI layer 130A may be minimized (e.g., in materials such as $Al_2O_3$ and $MgAl_2O_4$). Some examples of suitable materials for use in a high RI layer 130B include, without limitation, $Si_uAl_v$ $O_xN_y$, $Ta_2O_5$, $Nb_2O_5$, AlN, $Si_3N_4$, $AlO_xN_y$, $SiO_xN_y$, $SiN_x$, $SiN_x:H_y$, $HfO_2$, $TiO_2$, $ZrO_2$, $Y_2O_3$, $Al_2O_3$, $MoO_3$, and diamond-like carbon. In one or more embodiments, the high RI layer 130B may have high hardness (e.g., hardness of greater than 8 GPa), and the high RI materials listed above may comprise high hardness and/or scratch resistance. The oxygen content of the materials for the high RI layer 130B may be minimized, especially in $SiN_x$ or $AlN_x$ materials. $AlO_xN_y$ materials may be considered to be oxygen-doped $AlN_x$ (i.e., they may have an $AlN_x$ crystal structure (e.g., wurtzite) and need not have an AlON crystal structure).

As used herein, the "$AlO_xN_y$," "$SiO_xN_y$," and "$Si_uAl_xO_yN_z$" materials in the disclosure include various aluminum oxynitride, silicon oxynitride and silicon aluminum oxynitride materials, as understood by those with ordinary skill in the field of the disclosure, described according to certain numerical values and ranges for the subscripts, "u," "x," "y," and "z". That is, it is common to describe solids with "whole number formula" descriptions, such as $Al_2O_3$. It is also common to describe solids using an equivalent "atomic fraction formula" description such as $Al_{0.4}O_{0.6}$, which is equivalent to $Al_2O_3$. In the atomic fraction formula, the sum of all atoms in the formula is 0.4+0.6=1, and the atomic fractions of Al and O in the formula are 0.4 and 0.6 respectively. Atomic fraction descriptions are described in many general textbooks and atomic fraction descriptions are often used to describe alloys. (See, e.g.: (i) Charles Kittel, "Introduction to Solid State Physics," seventh edition, John Wiley & Sons, Inc., NY, 1996, pp. 611-627; (ii) Smart and Moore, "Solid State Chemistry, An Introduction," Chapman & Hall University and Professional Division, London, 1992, pp. 136-151; and (iii) James F. Shackelford, "Introduction to Materials Science for Engineers," Sixth Edition, Pearson Prentice Hall, New Jersey, 2005, pp. 404-418.)

Again referring to the "$AlO_xN_y$," "$SiO_xN_y$," and "$Si_uAl_xO_yN_z$" materials in the disclosure, the subscripts allow those with ordinary skill in the art to reference these materials as a class of materials without specifying particular subscript values. That is, to speak generally about an alloy, such as aluminum oxide, without specifying the particular subscript values, we can speak of $Al_vO_x$. The description $Al_vO_x$ can represent either $Al_2O_3$ or $Al_{0.4}O_{0.6}$. If v+x were chosen to sum to 1 (i.e., v+x=1), then the formula would be an atomic fraction description. Similarly, more complicated mixtures can be described, such as $Si_uAl_vO_xN_y$, where again, if the sum u+v+x+y were equal to 1, we would have the atomic fractions description case.

Once again referring to the "$AlO_xN_y$," "$SiO_xN_y$," and "$Si_uAl_xO_yN_z$" materials in the disclosure, these notations allow those with ordinary skill in the art to readily make comparisons to these materials and others. That is, atomic fraction formulas are sometimes easier to use in comparisons. For instance, an example alloy consisting of $(Al_2O_3)_{0.3}(AlN)_{0.7}$ is closely equivalent to the formula descriptions $Al_{0.448}O_{0.31}N_{0.241}$ and also $Al_{367}O_{254}N_{198}$. Another example alloy consisting of $(Al_2O_3)_{0.4}(AlN)_{0.6}$ is closely equivalent to the formula descriptions $Al_{0.438}O_{0.375}N_{0.188}$ and $Al_{37}O_{32}N_{16}$. The atomic fraction formulas $Al_{0.448}O_{0.31}N_{0.241}$ and $Al_{0.438}O_{0.375}N_{0.188}$ are relatively easy to compare to one another. For instance, Al decreased in atomic fraction by 0.01, O increased in atomic fraction by 0.065 and N decreased in atomic fraction by 0.053. It takes more detailed calculation and consideration to compare the whole number formula descriptions $Al_{367}O_{254}N_{198}$ and $Al_{37}O_{32}N_{16}$. Therefore, it is sometimes preferable to use atomic fraction formula descriptions of solids. Nonetheless, the use of $Al_vO_xN_y$ is general since it captures any alloy containing Al, O and N atoms.

As understood by those with ordinary skill in the field of the disclosure with regard to any of the foregoing materials (e.g., AlN) for the optical film 120, each of the subscripts, "u," "x," "y," and "z," can vary from 0 to 1, the sum of the subscripts will be less than or equal to one, and the balance of the composition is the first element in the material (e.g., Si or Al). In addition, those with ordinary skill in the field can recognize that "$Si_uAl_xO_yN_z$" can be configured such that "u" equals zero and the material can be described as "$AlO_xN_y$". Still further, the foregoing compositions for the optical film 120 exclude a combination of subscripts that would result in a pure elemental form (e.g., pure silicon, pure aluminum metal, oxygen gas, etc.). However, in some embodiments, each of the elements listed in the formula is present to some degree. Additionally, those with ordinary skill in the art will also recognize that the foregoing compositions may include other elements not expressly denoted (e.g., hydrogen), which can result in non-stoichiometric compositions (e.g., $SiN_x$ vs. $Si_3N_4$). Accordingly, the foregoing materials for the optical film can be indicative of the available space within a $SiO_2$—$Al_2O_3$—$SiN_x$—AlN or a $SiO_2$—$Al_2O_3$—$Si_3N_4$—AlN phase diagram, depending on the values of the subscripts in the foregoing composition representations.

According to one or more embodiments, exemplary $AlO_xN_y$ high RI materials may comprise from about 0 atom % to about 20 atom % oxygen, or from about 5 atom % to about 15 atom % oxygen, while including 30 atom % to about 50 atom % nitrogen. Exemplary $Si_uAl_xO_yN_y$ high RI materials may comprise from about 10 atom % to about 30 atom % or from about 15 atom % to about 25 atom % silicon, from about 20 atom % to about 40 atom % or from about 25 atom % to about 35 atom % aluminum, from about 0 atom % to about 20 atom % or from about 1 atom % to about 20 atom % oxygen, and from about 30 atom % to about 50 atom % nitrogen. The foregoing materials may be hydrogenated up to about 30% by weight. Where a material having a medium refractive index is desired, some embodiments may utilize AN and/or $SiO_xN_y$. It should be understood that a scratch-resistant layer 140 may comprise any of the materials disclosed as suitable for use in a high RI layer.

As depicted in FIG. 4, in one or more embodiments, the optical coating 120 may comprise a scratch-resistant layer 140 that is integrated as a high RI layer, and one or more low RI layers 130A and high RI layers 130B may be positioned over the scratch-resistant layer 140. The scratch-resistant layer may be alternately defined as the thickest high RI layer in the overall optical coating 120 or in the overall coated article 100. Without being bound by theory, it is believed that the coated article 100 may exhibit increased hardness at indentation depths when a relatively thin amount of material is deposited over the scratch-resistant layer 150. However, the inclusion of low RI and high RI layers over the scratch-resistant layer 140 may enhance the optical properties of the coated article 100. In some embodiments, relatively few layers (e.g., only 1, 2, 3, 4, or 5 layers) may be positioned over the scratch-resistant layer 140 and these layers may each be relatively thin (e.g. less than 100 nm, less than 75 nm, less than 50 nm, or even less than 25 nm).

The scratch-resistant layer 140 may be relatively thick as compared with other layers, such as greater than or equal to about 300 nm, 400 nm, 500 nm, 600 nm, 700 nm, 800 nm, 900 nm, 1 micron, 2 microns, 3 microns, 4 microns, 5 microns, 6 microns, 7 microns, or even 8 microns. For example a scratch-resistant layer may have a thickness from about 300 nm to about 10 microns, or from about 300 nm to about 9 microns, or from about 300 nm to about 8 microns, or from about 300 nm to about 7 microns, or from about 300 nm to about 6 microns, or from about 300 nm to about 5 microns, or from about 300 nm to about 4 microns, or from about 300 nm to about 3 microns, or from about 300 nm to about 2 microns.

According to one or more embodiments, the scratch-resistant layer 140 may comprise one or more materials chosen from $Si_uAl_vO_xN_y$, $Ta_2O_5$, $Nb_2O_5$, AlN, $Si_3N_4$, $AlO_xN_y$, $SiO_xN_y$, $SiN_x$, $SiN_x{:}H_y$, $HfO_2$, $TiO_2$, $ZrO_2$, $Y_2O_3$, $Al_2O_3$, $MoO_3$, diamond-like carbon, or combinations thereof. Exemplary materials used in the scratch-resistant layer 140 may include an inorganic carbide, nitride, oxide, diamond-like material, or combination thereof. Examples of suitable materials for the scratch-resistant layer 140 include metal oxides, metal nitrides, metal oxynitride, metal carbides, metal oxycarbides, and/or combinations thereof. Exemplary metals include B, Al, Si, Ti, V, Cr, Y, Zr, Nb, Mo, Sn, Hf, Ta and W. Specific examples of materials that may be utilized in the scratch-resistant layer 140 may include $Al_2O_3$, AlN, $AlO_xN_y$, $Si_3N_4$, $SiO_xN_y$, $Si_uAl_vO_xN_y$, diamond, diamond-like carbon, $Si_xC_y$, $Si_xO_yC_z$, $ZrO_2$, $TiO_xN_y$, and combinations thereof. The scratch-resistant layer 140 may also comprise nanocomposite materials, or materials with a controlled microstructure, to improve hardness, toughness, or abrasion/wear resistance. For example the scratch-resistant layer 140 may comprise nanocrystallites in the size range from about 5 nm to about 30 nm. In embodiments, the scratch-resistant layer 140 may comprise transformation-toughened zirconia, partially stabilized zirconia, or zirconia-toughened alumina. In embodiments, the scratch-resistant layer 140 exhibits a fracture toughness value greater than about 1 MPa$\sqrt{m}$ and simultaneously exhibits a hardness value greater than about 8 GPa. Fracture toughness of thin films is measured as described in D. S Harding, W. C. Oliver, and G. M. Pharr, Cracking During Indentation and its use in the Measurement of Fracture Toughness, Mat. Res. Soc. Symp. Proc., vol. 356, 1995, 663-668.

In one or more embodiments, the scratch-resistant layer 140 may comprise a compositional gradient. For example, a scratch-resistant layer 140 may include a compositional gradient of $Si_uAl_vO_xN_y$ where the concentration of any one or more of Si, Al, O and N are varied to increase or decrease the refractive index. The refractive index gradient may also be formed using porosity. Such gradients are more fully described in U.S. patent application Ser. No. 14/262,224, entitled "Scratch-Resistant Articles with a Gradient Layer", filed on Apr. 28, 2014, which is hereby incorporated by reference in its entirety.

The substrate 110 may include an inorganic material and may include an amorphous substrate, a crystalline substrate or a combination thereof. For example, the substrate 110 may include or consist of glass, ceramic, glass-ceramic, polymers, or combinations thereof. The substrate 110 may be formed from man-made materials and/or naturally occurring materials (e.g., quartz and polymers). For example, in some instances, the substrate 110 may be characterized as organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In some specific embodiments, the substrate 110 may specifically exclude polymeric, plastic and/or metal substrates. The substrate 110 may be characterized as alkali-including substrates (i.e., the substrate includes one or more alkalis). In one or more embodiments, the substrate exhibits a refractive index in the range from about 1.45 to about 1.55. In specific embodiments, the substrate 110 may exhibit an average strain-to-failure at a surface on one or more opposing major surface that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using ball-on-ring testing using at least 5 samples. The use of more than 5 samples would be expected to increase statistical accuracy. In specific embodiments, the substrate 110 may exhibit an average strain-to-failure at its surface on one or more opposing major surface of about 1.2%, about 1.4%, about 1.6%, about 1.8%, about 2.2%, about 2.4%, about 2.6%, about 2.8%, or about 3% or greater.

Suitable substrates 110 may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween. The Young's modulus value recited in this disclosure refers to a value as measured by a resonant ultrasonic spectroscopy technique of the general type set forth in ASTM E2001-13, titled "Standard Guide for Resonant Ultrasound Spectroscopy for Defect Detection in Both Metallic and Nonmetallic Parts."

In one or more embodiments, an amorphous substrate may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of lithia. In one or more alternative embodiments, the substrate 110 may include crystalline substrates such as glass ceramic substrates (which may be strengthened or non-strengthened) or may include a single crystal structure, such as sapphire. In one or more specific embodiments, the substrate 110 includes an amorphous base (e.g., glass) and a crystalline cladding (e.g., sapphire layer, a polycrystalline alumina layer and/or or a spinel ($MgAl_2O_4$) layer).

The substrate 110 of one or more embodiments may have a hardness that is less than the hardness of the article (as measured by the Berkovich Indenter Hardness Test described herein). The hardness of the substrate 110 may also be measured using the Berkovich Indenter Hardness Test.

The substrate 110 may be substantially optically clear, transparent and free from light scattering. In such embodiments, the substrate 110 may exhibit an average light transmission over the optical wavelength regime of about 85% or greater, about 86% or greater, about 87% or greater, about 88% or greater, about 89% or greater, about 90% or greater, about 91% or greater or about 92% or greater. In one or more alternative embodiments, the substrate 110 may be opaque or exhibit an average light transmission over the optical wavelength regime of less than about 10%, less than about 9%, less than about 8%, less than about 7%, less than about 6%, less than about 5%, less than about 4%, less than about 3%, less than about 2%, less than about 1%, or less than about 0.5%. In some embodiments, these light reflectance and transmittance values may be a total reflectance or total transmittance (taking into account reflectance or transmittance on both major surfaces of the substrate) or may be observed on a single side of the substrate (i.e., on the air-side surface 122 only, without taking into account the opposite surface). Unless otherwise specified, the average reflectance or transmittance of the substrate alone is measured at an incident illumination angle of 0 degrees relative to the substrate major surface 112 (however, such measurements may be provided at incident illumination angles of 45 degrees or 60 degrees). The substrate 110 may optionally exhibit a color, such as white, black, red, blue, green, yellow, orange etc.

Additionally or alternatively, the physical thickness of the substrate 110 may vary along one or more of its dimensions for aesthetic and/or functional reasons. For example, the edges of the substrate 110 may be thicker as compared to more central regions of the substrate 110. The length, width and physical thickness dimensions of the substrate 110 may also vary according to the application or use of the coated article 100.

The substrate 110 may be provided using a variety of different processes. For instance, where the substrate 110 includes an amorphous substrate such as glass, various forming methods can include float glass processes and down-draw processes such as fusion draw and slot draw.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate 110 is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

The degree of chemical strengthening achieved by ion exchange may be quantified based on the parameters of central tension (CT), surface CS, depth of compression (DOC), and depth of potassium layer (DOL). Compressive stress (including surface CS) may be measured by surface stress meter (FSM) using commercially available instruments such as the FSM-6000, manufactured by Orihara Industrial Co., Ltd. (Japan). Surface stress measurements may rely upon the accurate measurement of the stress optical coefficient (SOC), which is related to the birefringence of the glass. SOC, in turn, may be measured according to Procedure C (Glass Disc Method) described in ASTM standard C770-16, entitled "Standard Test Method for Measurement of Glass Stress-Optical Coefficient," the contents of which are incorporated herein by reference in their entirety. As used herein, DOC means the depth at which the stress in the chemically strengthened alkali aluminosilicate glass article described in some embodiments herein changes from compressive to tensile. DOC may be measured by FSM or a scattered light polariscope (SCALP) depending on the ion exchange treatment. Where the stress in the glass article is generated by exchanging potassium ions into the glass article, FSM may be used to measure DOC. Where the stress is generated by exchanging sodium ions into the glass article, SCALP may be used to measure DOC. Where the stress in the glass article is generated by exchanging both potassium and sodium ions into the glass, the DOC may be measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles may be measured by FSM. Maximum CT values may be measured using a scattered light polariscope (SCALP) technique known in the art.

In one or more embodiments, a strengthened substrate 110 can have a surface CS of 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened substrate may have a DOC of 10 µm or greater, 15 µm or greater, 20 µm or greater (e.g., 25 µm, 30 µm, 35 µm, 40 µm, 45 µm, 50 µm or greater) and/or a CT of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened substrate has one or more of the following: a surface CS greater than 500 MPa, a DOC greater than 15 µm, and a CT greater than 18 MPa.

Example glasses that may be used in the substrate 110 may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3) \geq 66$ mol. %, and $Na_2O \geq 9$ mol. %. In some embodiments, the glass composition includes 6 wt. % or more of aluminum oxide. In a further embodiments, the substrate 110 includes a glass composition with one or more alkaline earth oxides, such that a content of alkaline earth oxides is 5 wt. % or more. Suitable glass compositions, in some embodiments, further comprise at least one of $K_2O$, MgO, and CaO. In some particular embodiments, the glass compositions used in the substrate can comprise 61-75 mol. % SiO2; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $\leq (Li_2O+Na_2O+K_2O) \leq 20$ mol. % and 0 mol. % $\leq (MgO+CaO) \leq 10$ mol. %.

A still further example glass composition suitable for the substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $\leq (Li_2O+Na_2O+K_2O) \leq 18$ mol. % and 2 mol. % $\leq (MgO+CaO) \leq 7$ mol. %.

In some particular embodiments, an alkali aluminosilicate glass composition suitable for the substrate 110 comprises alumina, at least one alkali metal and, in some embodiments, greater than 50 mol. % $SiO_2$, in other embodiments 58 mol. % or more $SiO_2$, and in still other embodiments 60 mol. % or more $SiO_2$, wherein the ratio $(Al_2O_3+B_2O_3)/\Sigma\text{modifiers}$ (i.e., sum of modifiers) is greater than 1, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $(Al_2O_3+B_2O_3)/\Sigma\text{modifiers}$ (i.e., sum of modifiers) is greater than 1.

In still additional embodiments, the substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO. In alternative embodiments, the substrate 110 may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate 110 includes a crystalline substrate, the substrate may include a single crystal, which may include $Al_2O_3$. Such single crystal substrates are referred to as sapphire. Other suitable materials for a crystalline substrate include polycrystalline alumina layer and/or spinel ($MgAl_2O_4$).

Optionally, the crystalline substrate 110 may include a glass ceramic substrate, which may be strengthened or non-strengthened. Examples of suitable glass ceramics may include $Li_2O$—$Al_2O_3$—$SiO_2$ system (i.e. LAS-System) glass ceramics, MgO—$Al_2O_3$—$SiO_2$ system (i.e. MAS-System) glass ceramics, and/or glass ceramics that include a predominant crystal phase including β-quartz solid solution, β-spodumene ss, cordierite, and lithium disilicate. The glass ceramic substrates may be strengthened using the chemical strengthening processes disclosed herein. In one or more embodiments, MAS-System glass ceramic substrates may be strengthened in $Li_2SO_4$ molten salt, whereby an exchange of $2Li^+$ for $Mg^{2+}$ can occur.

The substrate 110 according to one or more embodiments can have a physical thickness ranging from about 100 μm to about 5 millimeters (mm) in various portions of the substrate 110. Example substrate 110 physical thicknesses range from about 100 μm to about 500 μm (e.g., 100, 200, 300, 400 or 500 μm). Further example substrate 110 physical thicknesses range from about 500 μm to about 1000 μm (e.g., 500, 600, 700, 800, 900 or 1000 μm). The substrate 110 may have a physical thickness greater than about 1 mm (e.g., about 2, 3, 4, or 5 mm). In one or more specific embodiments, the substrate 110 may have a physical thickness of 2 mm or less, or less than 1 mm. The substrate 110 may be acid polished or otherwise treated to remove or reduce the effect of surface flaws.

In one or more embodiments, the coated articles 100 of the disclosure include an ETC coating 170 that is characterized by a high durability. Accordingly, some embodiments of the coated articles 100 at the air-side surface 122 of the ETC coating 170 comprises an average contact angle with water of 95 or more degrees after being subjected to 3500 reciprocating cycles under a load of 1 kg, according to a Steel Wool Test (i.e., as described below). The exposed surface of the ETC coating 170 can also comprise an average contact angle with water of 95 or more degrees after being subjected to 5000 reciprocating cycles under a load of 1 kg according to the Steel Wool Test. In other aspects, an average contact angle of 95 or more degrees, 100 degrees, 105 degrees, 110 degrees, or even 115 degrees, (including all average contact angles between these levels) with water is retained by the exposed surface of the ETC coating 170 after 3000, or 3500, 7000, or even 10000, of such cycles according to the Steel Wool Test.

As used herein, the "Steel Wool Test" is a test employed to determine the durability of an ETC coating 170 disposed over a substrate 110 employed in the articles of the disclosure (e.g., coated articles depicted in FIGS. 1-4). At the beginning of a Steel Wool Test, a water contact angle is measured on the particular sample one or more times to obtain a reliable initial water contact angle. These water contact angle measurements can be conducted using a Krüss GmbH DSA100 drop shape analyzer or similar instrument. After the initial water contact angle is measured, a pad of Bonstar #0000 steel wool is affixed to an arm of a Taber® Industries 5750 linear abraser instrument. The steel wool pad was then allowed to make contact with the sample (on the ETC coating) under a load of 1 kg and set to reciprocate at 60 cycles/min. The average contact angle is then measured on the sample after 2000 cycles, 3500 cycles and/or another specified duration.

According to additional embodiments, the coated articles depicted in FIGS. 1-4 employ an optical coating 120 or optical stack 130 with an maximum hardness of 10 GPa or more. In some embodiments, the maximum hardness of these films can be about 11 GPa, or more, 12 GPa or more, 13 GPa or more, 14 GPa or more, 15 GPa or more, 16 GPa or more, 17 GPa or more, 18 GPa or more, 19 GPa or more, 20 GPa or more, and all maximum hardness values between these values. As used herein, the "maximum hardness value" of the optical coating 120 is reported as measured on the air-side surface 122 of the optical coating 120 using the Berkovich Indenter Hardness Test, and the "maximum hardness value" of the optical stack 130 is reported as measured on the top surface of the optical stack 130 (prior to the application of the adhesion coating 150 and ETC coating 170) using the Berkovich Indenter Hardness Test. More particularly, according to the Berkovich Indenter Hardness Test, hardness of thin film coatings as reported herein was determined using widely accepted nanoindentation practices. See: Fischer-Cripps, A. C., Critical Review of Analysis and Interpretation of Nanoindentation Test Data, Surface & Coatings Technology, 200, 4153-4165 (2006) (hereinafter "Fischer-Cripps"); and Hay, J., Agee, P, and Herbert, E., Continuous Stiffness measurement During Instrumented Indentation Testing, Experimental Techniques, 34 (3) 86-94 (2010) (hereinafter "Hay"). For coatings, it is typical to measure hardness and modulus as a function of indentation depth. So long as the coating is of sufficient thickness, it is then possible to isolate the properties of the coating from the resulting response profiles. It should be recognized that if the coatings are too thin (for example, less than ~500 nm), it may not be possible to completely isolate the coating properties as they can be influenced from the proximity of the substrate which may have different mechanical properties. See Hay. The methods used to report the properties herein are representative of the coatings themselves. The process is to measure hardness and modulus versus indentation depth out to depths approaching 1000 nm. In the case of hard coatings on a softer glass, the response curves will reveal maximum levels of hardness and modulus at relatively small indentation depths (less than or equal to about 200 nm). At deeper indentation depths both hardness and modulus will gradual diminish as the response is influenced by the softer glass substrate. In this case the coating hardness and modulus are taken be those associated with the regions exhibiting the maximum hardness and modulus. In the case of soft coatings on a harder glass substrate, the coating properties will be indicated by lowest hardness and modulus levels that occur at relatively small indentation depths. At deeper indentation depths, the hardness and modulus will gradually increase due to the influence of the harder glass. These profiles of hardness and modulus versus depth can be obtained using either the traditional Oliver and Pharr approach (as described in Fischer-Cripps) or by the more efficient continuous stiffness approach (see Hay).

Figure 7:
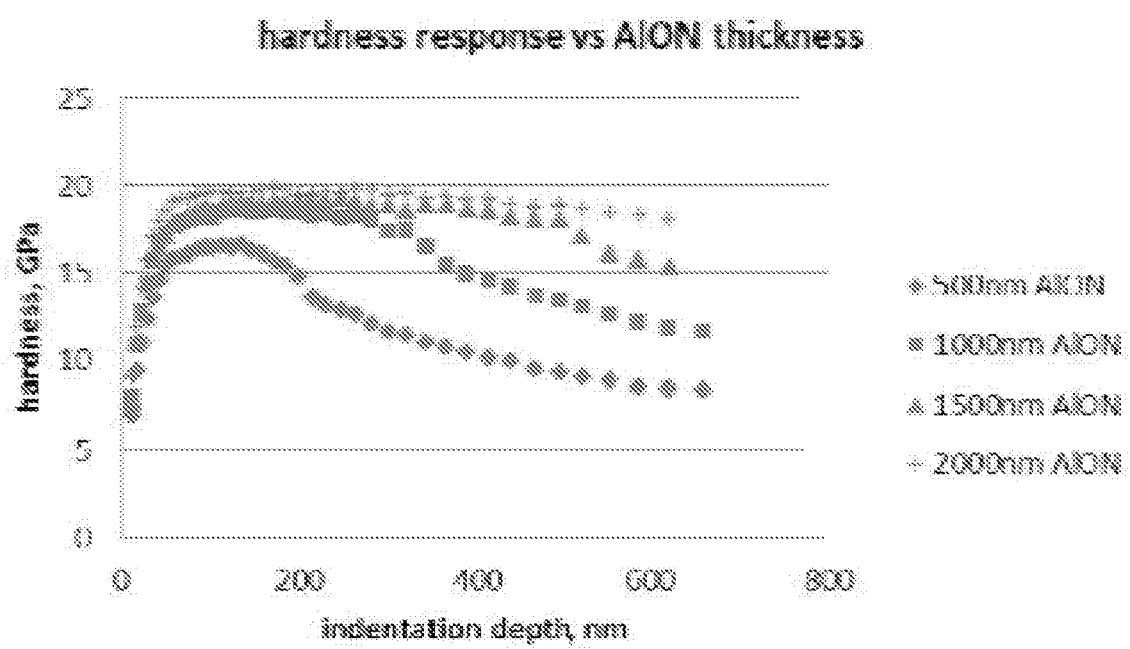
FIG. 7 is a chart depicting hardness response vs. layer thickness for an optical coating, according to one or more embodiments described herein.

For example, FIG. 7 illustrates the changes in measured hardness value as a function of indentation depth and thickness of a coating. As shown in FIG. 7, the hardness measured at intermediate indentation depths (at which hardness approaches and is maintained at maximum levels) and at deeper indentation depths depends on the thickness of a material or layer. FIG. 7 illustrates the hardness response of four different layers of $AlO_xN_y$ having different thicknesses. The hardness of each layer was measured using the Berkovich Indenter Hardness Test. The 500 nm-thick layer exhibited its maximum hardness at indentation depths from about 100 nm to 180 nm, followed by a dramatic decrease in hardness at indentation depths from about 180 nm to about 200 nm, indicating the hardness of the substrate influencing the hardness measurement. The 1000 nm-thick layer exhibited a maximum hardness at indentation depths from about 100 nm to about 300 nm, followed by a dramatic decrease in hardness at indentation depths greater than about 300 nm. The 1500 nm-thick layer exhibited a maximum hardness at indentation depths from about 100 nm to about 550 nm and the 2000-nm thick layer exhibited a maximum hardness at indentation depths from about 100 nm to about 600 nm. Although FIG. 7 illustrates a thick single layer, the same behavior is observed in thinner coatings and those including multiple layers such as the optical stack 130 of the embodiments described herein.

The elastic modulus and hardness values reported herein for such thin films were measured using the diamond nanoindentation methods, as described above, with a Berkovich diamond indenter tip.

According to one or more embodiments, the coated articles 100 described herein may have relatively high light transmittance and/or relatively low reflectance. For example, according to embodiments, the coated article 100 may have a light transmittance of 75% or more, 80% or more, 85% or more, or even 90% or more, for all wavelengths from 450 nm to 800 nm. In additional embodiments, the coated article 100 may have a light reflectance of 25% or less, 20% or less, 15% or less, or even 10% or less, for all wavelengths from 450 nm to 800 nm.

Figure 8:
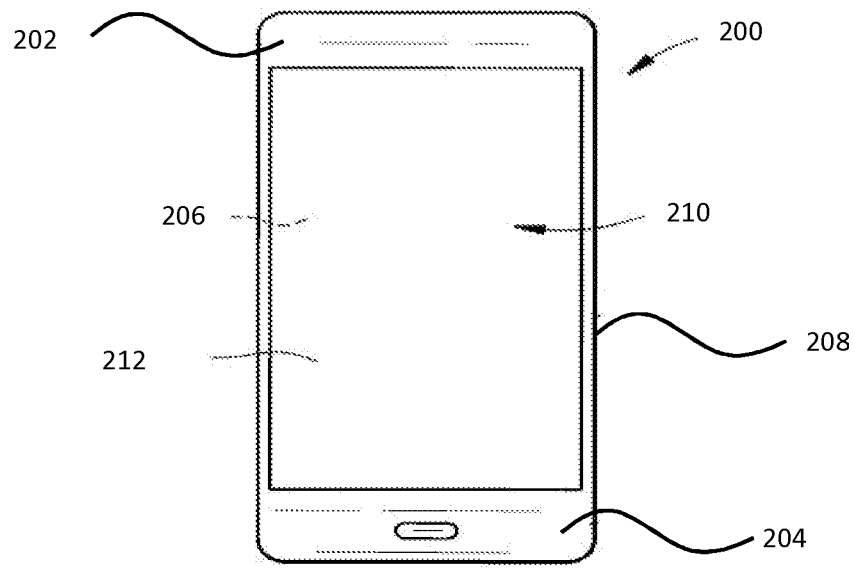
FIG. 8 is a plan view of an electronic device incorporating a coated article, according to one or more embodiments described herein.
Figure 9:
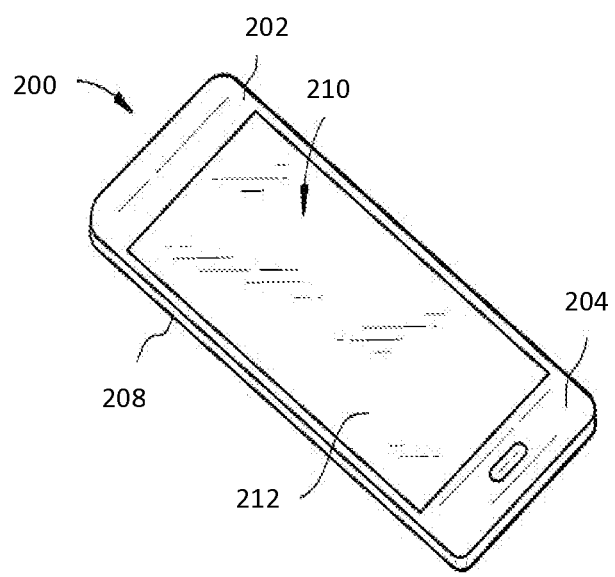
FIG. 9 is a perspective view of the electronic device of FIG. 8, according to one or more embodiments described herein according to one or more embodiments described herein.

The coated articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that would benefit from some transparency, scratch-resistance, abrasion resistance or a combination thereof. An exemplary article incorporating any of the coated articles disclosed herein is shown in FIGS. 8 and 9. Specifically, FIGS. 8 and 9 show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, at least one of the cover substrate 212 or a portion of housing 202 may include any of the coated articles disclosed herein.

EXAMPLES

The various embodiments of coated articles will be further clarified by the following examples. The examples are illustrative in nature, and should not be understood to limit the subject matter of the present disclosure.

Figure 5:
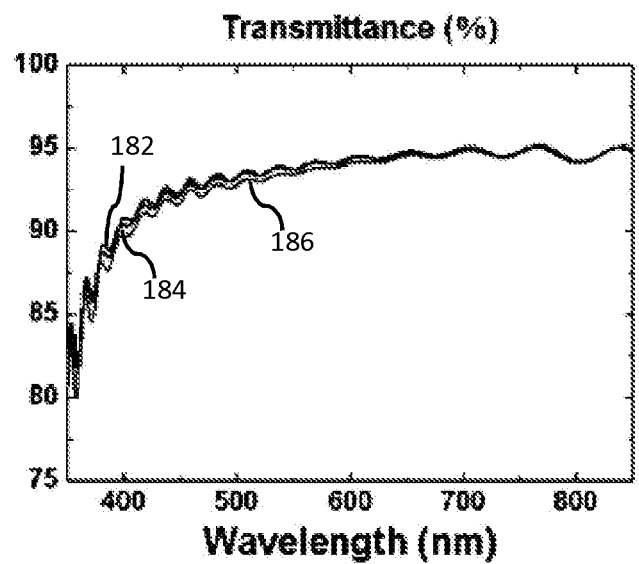
FIG. 5 is a chart showing light transmittance for samples of the coated article, according to one or more embodiments described herein.
Figure 6:
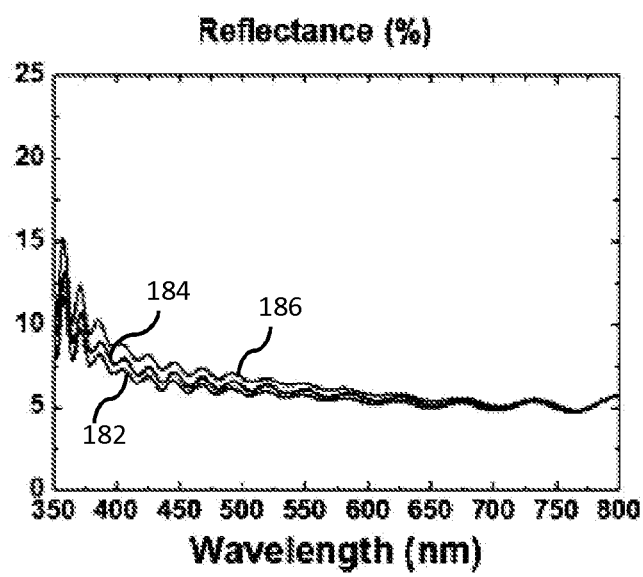
FIG. 6 is a chart showing light reflectance for samples of the coated article, according to one or more embodiments described herein.

Optical coatings were deposited on glass substrates as shown in Table 1. Sample A utilized a silica-only adhesion coating, whereas Samples 2 and 3 utilized alumina and silica in the adhesion coating. The glass substrates were made from glass having a nominal composition in mol. % of: 57.4% $SiO_2$; 16.1% $Al_2O_3$; 17% $Na_2O$; 2.8% MgO, and 6.5% $P_2O_5$. The glass substrate was 0.5 mm thick. The optical stack was deposited by sputtering. The silica-only adhesion coating or alumina and silica adhesion coating were deposited by PVD. The ETC coating consisted of PVD deposited SH-HT anti-fingerprint coating material (commercially available from DON Co., Ltd., Korea). Samples A, B, and C were measured for transmittance and reflectance, as shown in FIGS. 5 and 6, respectively. Sample A is represented by lines marked 182 in FIGS. 5 and 6, Sample B is represented by lines marked 184 in FIGS. 5 and 6, and Sample C is represented by lines marked 186 in FIGS. 5 and 6. Samples B and C containing the relatively thin layer of alumina in the adhesion coating showed good optical characteristics, such as high transmittance and low reflectance, similar to that of the Sample A.

TABLE 1

| | Sample A | | Sample B | | Sample C | |
|---|---|---|---|---|---|---|
| | Material | Thickness (nm) | Material | Thickness (nm) | Material | Thickness (nm) |
| ETC coating | SH-HT AF coating | ~5 | SH-HT AF coating | ~5 | SH-HT AF coating | ~5 |
| adhesion coating | silica | 20 | silica | 14 | silica | 8 |
| | | | alumina | 6 | alumina | 12 |
| optical stack | silica | 79 | silica | 79 | silica | 79 |
| | AlON | 31 | AlON | 31 | AlON | 31 |
| | silica | 17 | silica | 17 | silica | 17 |
| | AlON | 2000 | AlON | 2000 | AlON | 2000 |
| | silica | 8.9 | silica | 8.9 | silica | 8.9 |
| | AlON | 42.5 | AlON | 42.5 | AlON | 42.5 |
| | silica | 30.1 | silica | 30.1 | silica | 30.1 |
| | AlON | 24.9 | AlON | 24.9 | AlON | 24.9 |
| | silica | 52.4 | silica | 52.4 | silica | 52.4 |
| | AlON | 8 | AlON | 8 | AlON | 8 |

The abrasion resistance of Samples A-C was tested by the Steel Wool Test (described above) where samples were abraded and then measured for water contact angle. According to the testing, the Samples were abraded by steel wool with a 1 kg load and a stroke length of 50 mm (about 2 inches). Bonstar #0000 steel wool was used for the testing. The abrasion speed was 60 cycles/min. The testing utilized a varying amount of abrasion cycles, as is shown in Table 2.

The contact angle was determined using distilled water as the droplet media on a Krüss GmbH DSA100 drop shape analyzer. The contact angles on Table 2 represent the average contact angle from multiple testing runs. Each average contact angle was determined from at least 6 samples.

TABLE 2

| Abrasion cycles | Sample A | Sample B | Sample C |
|---|---|---|---|
| 0 | 113.6 | 113.7 | 113.8 |
| 3500 | 96.9 | 105.7 | 102.4 |
| 5000 | 91.9 | 105.0 | 102.7 |
| 7500 | Not Tested | 101.2 | 104.3 |
| 10000 | Not Tested | 101.1 | 102.7 |

As shown in the data of Table 2, Samples B and C, which contained the adhesion coating that included the alumina layer and the silica layer, maintained better average contact angle following abrasion cycles than Sample A, which contained only a silica adhesion layer. For example, following 3500 abrasion cycles, Samples B and C maintained a contact angle of 98 degrees or more, while Sample A did not. Additionally, following 500 abrasion cycles, Samples A and B maintained a contact angle of at least 95 degrees, while Sample A did not.

As used herein, the singular forms "a," "an" and "the" include plural referents unless the context clearly dictates otherwise. Thus, for example, reference to a "component" includes aspects having two or more such components, unless the context clearly indicates otherwise.

Directional terms as used herein—for example up, down, right, left, front, back, top, bottom—are made only with reference to the figures as drawn and are not intended to imply absolute orientation.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Ranges can be expressed herein as from "about" one particular value, and/or to "about" another particular value. As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

It is to be understood that various features disclosed in this specification and in the drawings can be used in any and all combinations. By way of non-limiting example the various features may be combined with one another as set forth in the following embodiments.

Embodiment 1

A coated article comprising:
a substrate having a major surface;
an optical coating disposed on the major surface of the substrate and forming an air-side surface, the optical coating comprising:
an optical stack;
an adhesion coating over the optical stack, the adhesion coating comprising an alumina layer and a silica layer over the alumina layer; and
an easy-to-clean coating over the adhesion coating and defining the air-side surface of the optical coating.

Embodiment 2

The coated article of Embodiment 1, wherein the easy-to-clean coating comprises one or more fluorinated compounds.

Embodiment 3

The coated article of Embodiment 1, wherein the easy-to-clean coating comprises one or more fluorinated silane compounds.

Embodiment 4

The coated article of any one of Embodiments 1-3, wherein the easy-to-clean coating is in direct contact with the silica layer of the adhesion coating.

Embodiment 5

The coated article of any one of Embodiments 1-4, wherein the alumina layer of the adhesion coating is in direct contact with the optical stack.

Embodiment 6

The coated article of any one of Embodiments 1-5, wherein:
the silica layer of the adhesion coating has a thickness of from 2 nm to 50 nm; and
the alumina layer of the adhesion coating has a thickness of from 2 nm to 30 nm.

Embodiment 7

The coated article of any one of Embodiments 1-6, wherein the optical stack comprises alternating layers of a high refractive index material and a low index material.

Embodiment 8

The coated article of any one of Embodiments 1-7, wherein the optical stack comprises one or more of $SiO_2$, $Al_2O_3$, $GeO_2$, $SiO$, $AlO_xN_y$, $AlN$, $SiN_x$, $SiO_xN_y$, $Si_uAl_yO_xN_y$, $Ta_2O_5$, $Nb_2O_5$, $TiO_2$, $ZrO_2$, $TiN$, $MgO$, $MgF_2$, $BaF_2$, $CaF_2$, $SnO_2$, $HfO_2$, $Y_2O_3$, $MoO_3$, $DyF_3$, $YbF_3$, $YF_3$, or $CeF_3$.

Embodiment 9

The coated article of any one of Embodiments 1-7, wherein the optical stack comprises a $AlO_xN_y$ material, a $Si_uAl_xO_yN_z$ material, or both.

Embodiment 10

The coated article of any one of Embodiments 1-9, wherein the optical stack comprises an uppermost layer comprising silica.

Embodiment 11

The coated article of any one of Embodiments 1-10, wherein the optical coating has a maximum hardness of 10 GPa or more.

Embodiment 12

The coated article of any one of Embodiments 1-11, wherein the coated article has a light reflectance of 25% or less for all wavelengths from 450 nm to 800 nm.

Embodiment 13

The coated article of any one of Embodiments 1-12, wherein the coated article has a light transmittance of 75% or more for all wavelengths from 450 nm to 800 nm.

Embodiment 14

The coated article of any one of Embodiments 1-13, wherein the easy-to-clean coating at the air-side surface comprises an average contact angle with water of 98 degrees or more after being subjected to 3500 reciprocating cycles under a load of 1 kg according to a Steel Wool Test.

Embodiment 15

The coated article of any one of Embodiments 1-13, wherein an exposed surface of the easy-to-clean coating comprises an average contact angle with water of 95 degrees or more after being subjected to 5000 reciprocating cycles under a load of 1 kg according to a Steel Wool Test.

Embodiment 16

A consumer electronic product comprising:
a housing comprising a front surface, a back surface and side surfaces;
electrical components at least partially within the housing, the electrical components comprising at least a controller, a memory, and a display, the display at or adjacent the front surface of the housing; and
a cover substrate disposed over the display,
wherein at least one of a portion of the housing or the cover substrate comprises the coated article of any one of Embodiments 1-15.

Embodiment 17

A method for depositing an optical coating on a substrate, the method comprising:
depositing an optical stack over a major surface of the substrate;
depositing an adhesion coating over the optical stack, the adhesion coating comprising an alumina layer and a silica layer over the alumina layer; and
depositing an easy-to-clean coating over the adhesion coating, wherein the easy-to-clean coating defines an air-side surface of the optical coating.

Embodiment 18

The method of Embodiment 17, wherein the easy-to-clean coating comprises one or more fluorinated compounds.

Embodiment 19

The method of Embodiment 17 or Embodiment 18, wherein the easy-to-clean coating is in direct contact with the silica layer of the adhesion coating.

Embodiment 20

The method of any one of Embodiments 17-19, wherein the alumina layer of the adhesion coating is in direct contact with the optical stack.

The invention claimed is:

1. A coated article comprising:
   a substrate having a major surface;
   an optical coating disposed on the major surface of the substrate and forming an air-side surface, the optical coating comprising:
      an optical stack;
      an adhesion coating over the optical stack, the adhesion coating comprising an alumina layer and a silica layer over the alumina layer; and
      an easy-to-clean coating over the adhesion coating and defining the air-side surface of the optical coating.

2. The coated article of claim 1, wherein the easy-to-clean coating comprises one or more fluorinated compounds.

3. The coated article of claim 1, wherein the easy-to-clean coating comprises one or more fluorinated silane compounds.

4. The coated article of claim 1, wherein the easy-to-clean coating is in direct contact with the silica layer of the adhesion coating.

5. The coated article of claim 1, wherein the alumina layer of the adhesion coating is in direct contact with the optical stack.

6. The coated article of claim 1, wherein:
   the silica layer of the adhesion coating has a thickness of from 2 nm to 50 nm; and
   the alumina layer of the adhesion coating has a thickness of from 2 nm to 30 nm.

7. The coated article of claim 1, wherein the optical stack comprises alternating layers of a high refractive index material and a low index material.

8. The coated article of claim 1, wherein the optical stack comprises one or more of $SiO_2$, $Al_2O_3$, $GeO_2$, SiO, $AlO_xN_y$, AlN, $SiN_x$, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, or $CeF_3$.

9. The coated article of claim 1, wherein the optical stack comprises a $AlO_xN_y$ material, a $Si_uAl_xO_yN_z$ material, or both.

10. The coated article of claim 1, wherein the optical stack comprises an uppermost layer comprising silica.

11. The coated article of claim 1, wherein the optical coating has a maximum hardness of 10 GPa or more.

12. The coated article of claim 1, wherein the coated article has a light reflectance of 25% or less for all wavelengths from 450 nm to 800 nm.

13. The coated article of claim 1, wherein the coated article has a light transmittance of 75% or more for all wavelengths from 450 nm to 800 nm.

14. The coated article of claim 1, wherein the easy-to-clean coating at the air-side surface comprises an average contact angle with water of 98 degrees or more after being subjected to 3500 reciprocating cycles under a load of 1 kg according to a Steel Wool Test.

15. The coated article of claim 1, wherein an exposed surface of the easy-to-clean coating comprises an average contact angle with water of 95 degrees or more after being subjected to 5000 reciprocating cycles under a load of 1 kg according to a Steel Wool Test.

16. A consumer electronic product comprising:
   a housing comprising a front surface, a back surface and side surfaces;
   electrical components at least partially within the housing, the electrical components comprising at least a controller, a memory, and a display, the display at or adjacent the front surface of the housing; and
   a cover substrate disposed over the display,
   wherein at least one of a portion of the housing or the cover substrate comprises the coated article of claim 1.

17. A method for depositing an optical coating on a substrate, the method comprising:
   depositing an optical stack over a major surface of the substrate;
   depositing an adhesion coating over the optical stack, the adhesion coating comprising an alumina layer and a silica layer over the alumina layer; and
   depositing an easy-to-clean coating over the adhesion coating, wherein the easy-to-clean coating defines an air-side surface of the optical coating.

18. The method of claim 17, wherein the easy-to-clean coating comprises one or more fluorinated compounds.

19. The method of claim 17, wherein the easy-to-clean coating is in direct contact with the silica layer of the adhesion coating.

20. The method of claim 17, wherein the alumina layer of the adhesion coating is in direct contact with the optical stack.

* * * * *